United States Patent [19]
Efland et al.

[11] Patent Number: 6,140,702
[45] Date of Patent: Oct. 31, 2000

[54] PLASTIC ENCAPSULATION FOR INTEGRATED CIRCUITS HAVING PLATED COPPER TOP SURFACE LEVEL INTERCONNECT

[75] Inventors: Taylor R. Efland, Richardson; Dale J. Skelton, Plano; Quang X. Mai, Sugar Land; Charles E. Williams, Dallas, all of Tex.

[73] Assignee: Texas Instruments Incorporated, Dallas, Tex.

[21] Appl. No.: 08/864,386

[22] Filed: May 28, 1997

[51] Int. Cl.[7] .................................................. H01L 23/48
[52] U.S. Cl. ......................... 257/762; 257/784; 257/787
[58] Field of Search .................................... 257/784, 676, 257/684, 762, 787

[56] References Cited

U.S. PATENT DOCUMENTS

| | | | |
|---|---|---|---|
| 3,593,068 | 7/1971 | Rosier | 317/234 |
| 4,080,485 | 3/1978 | Bonkohara | 428/620 |
| 4,835,120 | 5/1989 | Mallik et al. | |
| 4,843,453 | 6/1989 | Hooper et al. | 357/71 |
| 4,845,543 | 7/1989 | Okikawa et al. | 257/784 |
| 4,890,142 | 12/1989 | Tonnel et al. | 357/23.4 |
| 4,931,323 | 6/1990 | Manitt et al. | 427/53.1 |
| 5,060,050 | 10/1991 | Tsuneoka et al. | 357/71 |
| 5,060,051 | 10/1991 | Usuda | 257/784 |
| 5,191,405 | 3/1993 | Tomita et al. | 257/777 |
| 5,229,646 | 7/1993 | Tsumura | 257/782 |
| 5,272,098 | 12/1993 | Smayling et al. | 437/41 |
| 5,441,684 | 8/1995 | Lee . | |
| 5,495,667 | 3/1996 | Farnworth et al. | 29/843 |
| 5,637,922 | 6/1997 | Fillion et al. | 257/728 |
| 5,646,828 | 7/1997 | Degani et al. | 361/715 |

FOREIGN PATENT DOCUMENTS

| | | |
|---|---|---|
| 0 103 362 | 6/1983 | European Pat. Off. . |
| 0 296 997 | 6/1983 | European Pat. Off. . |
| 0 374 971 | 12/1989 | European Pat. Off. . |
| 0 714 128 A2 | 2/1995 | European Pat. Off. . |

OTHER PUBLICATIONS

"A 300MHz 115W 32b Bipolar ECL Microprocessor With On–Chip Caches", 1993 IEEE International Solid–State Circuits Conference, Feb. 25, 1993, pp. 84–85 and 60–61 (Norman P. Jouppi, Patrick Boyle, Jeremy Dion, Mary Jo Doherty, Alan Eustace, Ramsey Haddad, Robert Mayo, Suresh Menon, Louis Monier, Don Stark, Silvio Turrini, Leon Yang).

"Intelligent Power Integrated Circuits History and Overview", TI Technical Journal, Mar.–Apr. 1994, pp. 2–9 (Andrew Marshall).

(List continued on next page.)

*Primary Examiner*—Roy Potter
*Attorney, Agent, or Firm*—Mark E. Courtney; Wade James Brady; Frederick J. Telecky, Jr.

[57] ABSTRACT

A plastic packaged integrated circuit (20) having a thick copper plated top surface level interconnection structure. A semiconductor integrated circuit (20) is formed having devices at the surface of a semiconductor substrate (23). First and second metallization layers (27, 31) are formed over the substrate and contacting selected ones of said devices. The first and second levels of metallization may be in contact with one another through vias. A thick top surface level metal interconnect layer (35) is then formed over the second metal layer (31), either physically contacting it or selectively electrically contacting it. The surface level metal (35) is fabricated of a highly conductive copper layer. The thick surface level metal layer (35) substantially lowers the resistance of the interconnect metallization of the device (20) and further eliminates current debiasing and early failure location problems experienced with integrated circuits of the prior art. In one embodiment, the copper surface level interconnect layer (35) is coated with a thin barrier layer of material (37) which may receive a bond wire. The entire structure is then encapsulated in a plastic package (22) such that the plastic is in physical contact with the copper interconnect metal (35). The use of the plastic packaging (22) in physical contact with the copper interconnect metal (35) eliminates the need for the passivation layers of the prior art. Other devices and methods are described.

12 Claims, 1 Drawing Sheet

OTHER PUBLICATIONS

"Lateral DMOS Structure Development for Advanced Power Technologies", TI Technical Journal, Mar.–Apr. 1994, pp. 10–24 (Taylor Efland).

"PRISM Power IC Design Aspects", TI Technical Journal, Mar.–Apr. 1994, pp. 25–36 (Ross Teggatz, Joe Devore, Wayne Chen and Tom Schmidt).

"The Evolution of an Analog Standard Cell in the PRISM™ Process", TI Technical Journal, Mar.–Apr. 1994, pp. 37–45 (Tom Schmidt, Ross Teggatz, Joe Devore and Wayne Chen).

"Safe Operating Area Testing", TI Technical Journal, Mar.–Apr. 1994, pp. 82–92 (Taylor Efland, Andrew Marshall, Dale Skelton and Travis Summerlin).

"Thermal Impedance Packaging Concerns for Power ICs" TI Technical Journal, Mar.–Apr. 1994, pp. 66–76 (Dale Skelton, Travis Summerlin and Kathy Frank).

"Custom Automotive Requirements for Power Integrated Circuits", TI Technical Journal, Mar.–Apr. 1994, pp. 93–98 (Andrew Marshall and Bill Grose).

PLASTIC ENCAPSULATION FOR INTEGRATED CIRCUITS HAVING PLATED COPPER TOP SURFACE LEVEL INTERCONNECT

CROSS REFERENCE TO RELATED APPLICATIONS

This application relates to co-pending patent applications:

U.S. patent application Ser. No. 07/850,601, entitled "Method for Current Ballasting and Busing over Active Device Area Using a Multi-Level Conductor Process", filed Mar. 13, 1992;

U.S. patent application Ser. No. 08/333,174, entitled "Multiple Transistor Integrated Circuit with Thick Copper Interconnect", filed Nov. 2, 1994;

U.S. Pat. No. 5,468,984, entitled "ESD Protection Structure Using LDMOS Diodes with Thick Copper Interconnect", issued Nov. 21, 1995;

U.S. Pat. No. 5,346,835, entitled "A Triple Diffused Lateral Resurf Insulated Gate Field Effect Transistor Compatible", issued Sep. 13, 1994;

U.S. Provisional Patent No. 60/017,714, entitled "Lateral DMOS Transistor with Resurf Drain Region Self-Aligned to LOCOS Field Oxide", filed May. 15, 1996; and U.S. patent application Ser. No. 08/538,873, entitled "Method and Apparatus for a Thick Metal Interconnection for Power Devices", filed Oct. 4,1995;

each of which is assigned to Texas Instruments Incorporated.

FIELD OF THE INVENTION

This invention relates generally to the fabrication of integrated circuits utilizing thick plated copper metallization top surface layers to reduce resistance of circuit interconnections and of the bond wires used to connect the bond pads of the integrated circuit to leads of a leadframe, and specifically to the production of integrated circuits having thick copper metal interconnect in plastic packages.

BACKGROUND OF THE INVENTION

In producing integrated circuits for power applications in the prior art, it is typical to use source and drain diffusions that are interconnected to form one or a few large transistors from many individual source and drain regions. Devices are often designed using a plurality of these lateral diffusions which are then coupled together to make a single large current capacity device, or several large current carrying devices. In order to achieve the desired performance in such a device, a very low resistance interconnection structure for the plurality of diffusions is required. Other applications may likewise require the interconnection of many devices in parallel where a very low resistance interconnection structure is desirable.

In the prior art, single and double level metallization schemes are used to make the connections between the various diffusions and thereby form the large devices required for circuits. Because the lengths of the metal runs are quite long in some integrated circuits, current distribution tends to become nonuniform across the devices. As a further consequence, debiasing also occurs along the metal lengths, which results in different areas of the device operating at different potentials. Non-uniform operation of the device results from this metal debiasing and the various diffused areas switch at different instants, causing nonuniform current distribution.

FIG. 1 depicts a cross sectional view of a prior art plastic encapsulated integrated circuit. In FIG. 1, a completed silicon integrated circuit die 17 is attached to the die pad of lead frame 11 by an epoxy or die attach compound or other die attach method. The leadframe and die assembly are placed in a automated wire bonding station, and bond wires 13 are attached between the leads of the lead frame 11 and bond pad areas defined in the surface of the uppermost layer of metallization on die 17. The wire bonded die 17 and leadframe 11 are then placed in a mold press for encapsulation. In the mold press, package 15 is formed of a thermoplastic resin mold compound which is forced under heat and pressure through runners and into a cavity surrounding the die 17, the die pad, and the bond wires 13, and partially including the leads of the leadframe 11. The resulting package then covers the die 17, bond wires 13, and the die pad, so that the packaged IC is a plastic package with a plurality of leads extending out of it, typically the leads come out in two lines, as in the dual in-line package, or on each of the four sides, as for the quad flat pack (QFP) packages and small outline packages (SOIC).

Although the conventional two level metallization schemes of the prior art can be optimized to reduce the current debiasing problems, for fabricating large devices carrying large current loads the problems with debiasing remain. One approach to a two metal interconnection scheme for an LDMOS power device composed of many diffusion stripes is described in a co-pending U.S. patent application entitled "A Method for Current Ballasting and Busing over Active Device Area Using a Multi-Level Conductor Process", TI-16545, U.S. application Ser. No. 07/850,601, assigned to Texas Instruments Incorporated and herein incorporated by reference. Although the techniques and structures for placing the contacts and vias in a two level metal interconnection scheme described in this earlier patent application will reduce the debiasing effects as much as possible using conventional metallization techniques, the debiasing and current distribution problems persist for large transistors having long interconnect metal lengths.

Further problems arise as higher current capacity devices are designed using the prior art techniques. The nonuniformity of current distribution associated with debiasing can lead to so called "hot spots", areas where localized current exceeds the thermal power limits of the device, and premature failure locations are the result. These premature failures further result in lower peak current capacity ratings for the devices and a reduced safe operating area rating.

As a means to reduce the interconnection resistance of these power devices, a thick level metallization layer plated over the conventional first and second level metal levels has been proposed. As a conductor material, copper has been suggested as described in some of the co-pending patent applications, identified as related applications above. For example, in constructing high power lateral devices using MOS technology, many lateral drain and source diffusion regions are created and then coupled together. Adding a thick level copper interconnection metal to the conventional aluminum interconnection structures has been found to reduce the on resistance of the resulting devices, eliminate non-uniform switching, hot spots, and electromigration, and expand the current carrying capacity and safe operation area for these devices.

To add the third level metal layer to a conventional integrated circuit, the integrated circuit die is given a protective overcoat oxide layer, or alternatively nitride or oxinitride layer, and removed from the conventional processing area. A thick copper layer is then formed at the top surface using an electroplating or an electroless plating technique. The copper interconnect is formed either in direct physical contact with the aluminum second level metal, or optionally an isolation layer is used, vias are formed, and the aluminum busses are selectively coupled to busses formed of the thick level metal copper layer.

The copper surface level interconnection process provides a low resistance solution to many of the problems with the prior art. The use of the copper interconnect level eliminates the debiasing caused by the resistance of long runs of conventional aluminum interconnect levels, because the resistance of the new structure is so low that there is little or no measurable debiasing effect. Further, non-uniform switching and electromigration problems are also practically eliminated by the low resistance interconnection structure that results.

However, problems remain in packaging the copper surface level interconnect devices. In the prior art, packaging integrated circuits in conventional plastic encapsulation packages which have reactive or active materials on them has been avoided. Copper is such a material. The plastic packages commonly used in such packaging are not hermetic packages. If a volatile or reactive material is used within the package, therefore, it may react with moisture, sodium or oxygen contaminants that enter the package. The integrated circuit package is also thermally cycled during use and the heat may catalyze the reaction of the materials with the contaminants, and thereby exacerbate the formation of compounds that damage the device or cause failures in the devices while in use, such as shorting compounds or corrosion sites. The conventional technique for overcoming these problems is to use passivation materials over the metal layers within the integrated circuit. Nitrides and oxides can be deposited on all surfaces of the reactive material and the layer of nitride or oxide used to contain the reactive material within an inert layer of stable material. For example, the conventional first and second aluminum metal layers are typically passivated with nitride.

The copper interconnection levels used in these low resistance devices incorporating the invention are very thick layers. Some devices have been designed with up to 50 microns of copper bussing over the top of the conventional structure. This copper surface level interconnect layer is essentially similar to a huge rectangular bar of copper placed over the conventional wafer. Existing techniques for adding passivation to materials cannot successfully cover and passivate such a large step distance from the lower layers. Accordingly, a need thus exists for a method and apparatus which provides a reliable integrated circuit device with a plated copper interconnection surface layer encapsulated in a plastic package.

SUMMARY OF THE INVENTION

Generally, and in one form of the invention, an integrated circuit having a thick plated copper top surface layer for interconnect, and a method and apparatus for subsequently forming a plastic package for the resulting completed integrated circuit, is provided.

A first advantage of the invention is that the use of the preferred embodiment results in a reliable low interconnect resistance integrated circuit device with high current carrying capacity. The use of the invention lowers the resulting resistance of the interconnection layers of the integrated circuit device and results in a faster switching time. Use of the invention further helps to provide uniform current switching at high operating speeds. The use of the thick copper interconnect layer at the surface of the device further provides an inherent heat sinking capability which improves the thermal capacity and current carrying capability of the device and reduces the need for external cooling or heat sinks.

BRIEF DESCRIPTION OF THE DRAWINGS

In the drawings.

Corresponding numerals and symbols in the different figures refer to corresponding parts unless otherwise indicated in the specification and the figures.

DETAILED DESCRIPTION OF PREFERRED EMBODIMENTS

Figure 1:
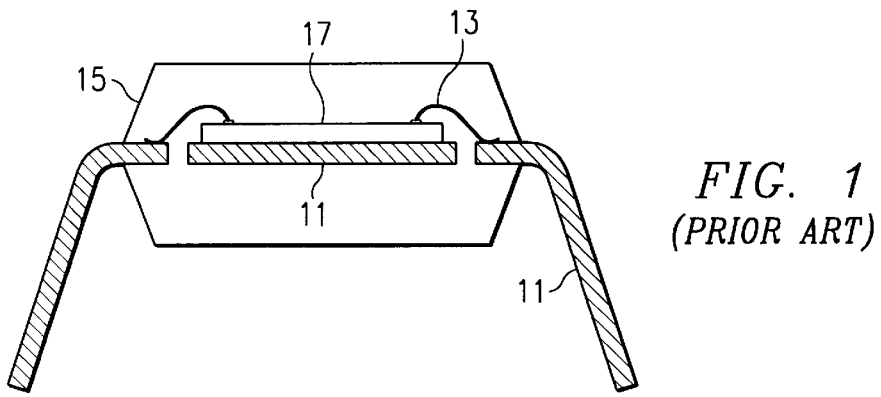
FIG. 1 depicts a cross sectional view of a prior art plastic encapsulated integrated circuit.
Figure 2:
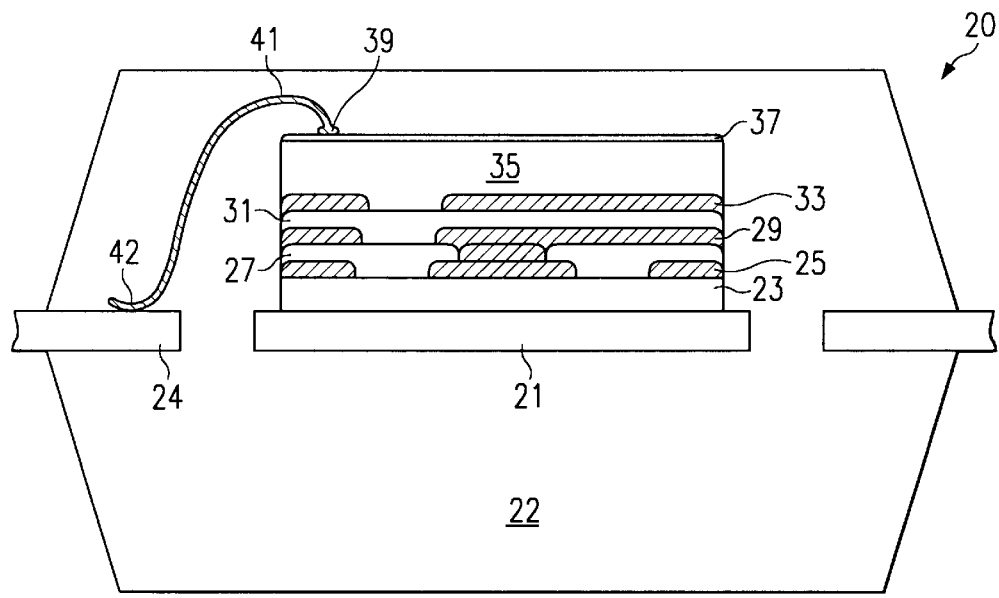
FIG. 2 depicts a cross sectional view of first embodiment of an integrated circuit having the thick copper top surface level metallization layer and encapsulated in a plastic package using the method and apparatus of the invention.

FIG. 2 depicts a cross section of a plastic encapsulated silicon integrated circuit 20 having conventional first and second layers of aluminum metal interconnection and incorporating the plated copper surface level metal interconnect layer of the invention, to which is bonded a bonding wire. The bonding wire may be any conventional material, for example, gold, aluminum, copper or their alloys.

In FIG. 2, circuit elements, not visible, are formed in a silicon substrate 23 using conventional silicon processing steps of doping diffusions, etching and patterning. Once the circuit elements are completed, an isolation oxide 25 is formed over the substrate. The isolation oxide 25 is patterned using conventional silicon processing techniques to form contacts that expose selected areas in the silicon which are to be contacted by interconnect metal. A first level metal interconnect 27 is formed of aluminum or other alternatives well known to the art. At the contact areas formed in oxide 25, the first level metal 27 will contact and electrically couple the silicon contacted to the first level metal. A second isolation oxide 29 is formed over the first level metal. This second layer of oxide 29 is then patterned and etched through the isolation oxide. The etching step is done to expose certain via areas in the first level metal layer 27 where it is desired to couple the second level metal to the first level metal. Second level metal 31 is then deposited over the isolation oxide layer 29 and contacts the first level metal in the via areas. A protective overcoat layer 33 is then formed over the second level metal layer 31.

All of the steps described thus far are conventional silicon integrated circuit processing steps well known in the art. At this stage the die is removed from the conventional silicon wafer processing equipment and the metal plating steps begin. Optionally, protective overcoat 33 is patterned to define vias which will couple the copper third level metal to the second level metal at selected places. Alternatively, protective overcoat 33 is removed from the die altogether, if it is desired that the copper top surface level metal be in continuous contact with the second level metal layer 35. The copper top surface level metal is electroplated onto the integrated circuit die and contacts the second level metal layer 31. This may done, for example, in two steps. A thin seed layer of copper is sputtered on over the surface of the integrated circuit. A pattern is then formed in a thick photoresist over the seed layer. The seed layer is then followed by a copper electroplating or electroless plating process to form the thick copper top layer over the seed layer in the pattern defined by the thick photoresist. The copper surface level metal 35 is typically plated to a thickness from 10 microns to up to 50 microns or more, to maximize the benefit of using a low resistance bussing conductor to complete the interconnection of the device. Thick gold could be used as an alternative to the copper in layer 35, however, the cost of gold is substantially higher, and copper is actually preferred over gold as a conductor.

In the embodiment shown in FIG. 2, a thin plating layer or barrier layer 37 is placed over the copper surface layer 35. Typically this barrier layer is less than one micron thick. This barrier layer is plated onto the copper thick level interconnect 35. The thin plating layer 37 is performed to enable conventional aluminum bond wires to be wedge bonded to the surface level metal layer 37. If the copper top surface level interconnect layer is used without the thin plating layer 37, no reliable bond may be formed on the copper, because the bond wire material and copper are not compatible for conventional wedge bonding techniques. Typically, when aluminum bonding wires are used, the barrier layer 37 will comprise nickel or a nickel alloy. Many other alternatives exist, however, especially palladium, and other barrier metals. If palladium is used, bonding may be reliably performed using aluminum, gold or copper bond wires. Another alternative is to use copper bond wires and omit the plating layer 37, forming a copper to copper bond. However, the use of copper bond wires poses problems not associated with aluminum and gold bond wires, which are currently preferred by the industry. If nickel is used as a barrier layer, a bond may also be formed to a copper bond wire using a nickel-copper bond. The preferred embodiments described here are exemplary in the use of aluminum bonding wires, the use of other wire types such as copper or copper alloys may provide reliable bonds to the copper layer 35 without the need for barrier layer 37.

After the plating of the barrier layer 37, the integrated circuit is attached to the die pad 21 of a lead frame, using die attach epoxy or solder techniques, and the wire bonding process is performed. A bond 39 is shown in FIG. 2, which physically couples the bond wire 41 to the thin barrier layer 37 and of course couples the wire 41 electrically to the copper layer 35. At the other end of the bond wire 41, a conventional bond is used to couple the lead 24 to the bond wire 41.

The completed die and leadframe assembly is packaged in a thermoplastic mold compound using conventional transfer molding techniques to form package 22. The die and leadframe assembly is placed in the bottom mold chase of a transfer mold press. A top mold chase is brought into contact with the bottom mold chase, the top and bottom mold chases defining the interior aspects of the package 22 with top and bottom package cavities. The mold press heats the top and bottom mold chases to the molding compound transfer temperature, usually around 185 degrees Celsius. A ram or plunger is used to force a piece of mold compound, heated to its transfer temperature, into runners and through sleeves that couple the mold compound pot to the individual package cavities. The thermoset plastic is forced under heat and pressure into the package cavities and fills the package cavities to form the package 22. The thermoset plastic mold compound is in physical contact with and coats and protects the exposed surfaces of the thick copper layer 35. The continued heating of the mold compound after the package is formed causes an initial curing of the package 22. The packaged devices are then forced from the mold chases and removed to completely cure. Trim, form and lead conditioning steps are performed in the conventional manner for processes used for integrated circuits, and the packages are symbolized and tested for functionality using conventional methodology.

The bonded lead frame and integrated circuit assembly comprised of die 23 and the subsequent metallization layers 27, 31, 35, and 37, bond wire 41, die pad 21 and leadframe leads 24 are now packaged in a plastic encapsulation package 22. In the prior art it was thought that in order to reliably package a reactive metal, such as copper, in a plastic package, which is a non-hermetic package, a passivation step would be required before the integrated circuit could be packaged in plastic.

However, it has now been surprisingly discovered that if the copper layer 35 is left unpassivated and a plastic encapsulation step is then performed such that the mold compound is in physical contact with the copper layer 35, the resulting packaged integrated circuit 20 passes stringent lifetime reliability tests for integrated circuits. Apparently, a beneficial interface forms between the copper surface of layer 35 and the thermoplastic mold compound that makes up package 22, and thereby eliminates the need for the passivation step of the prior art. Because the passivation of the prior art is not possible for the very thick copper layers used, the packaged integrated circuit shown in FIG. 2 could not be passivated as required by the prior art.

Figure 3:
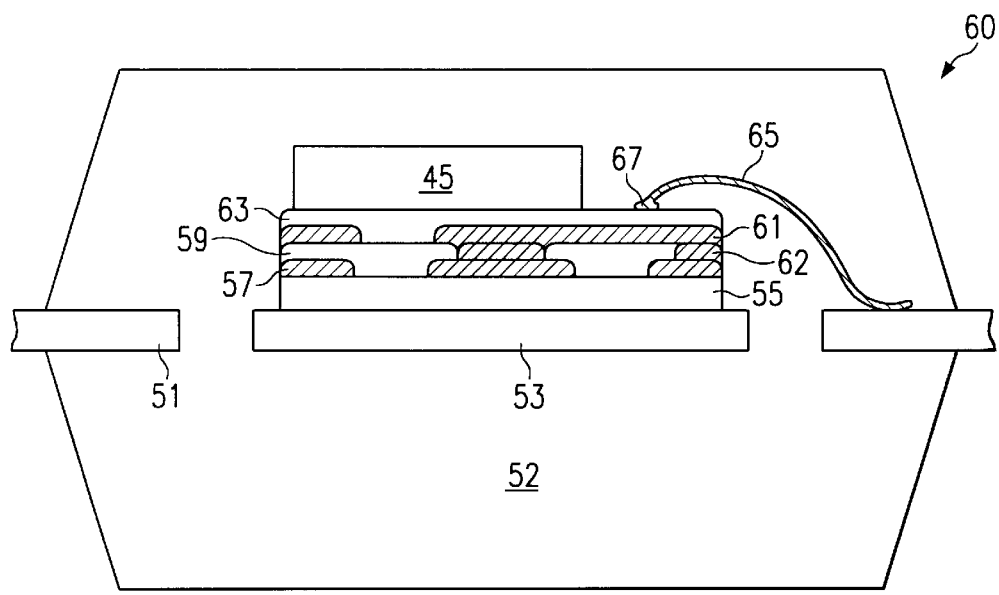
FIG. 3 depicts a cross sectional view of a second embodiment of an integrated circuit having a thick copper top surface level metallization layer and encapsulated in a plastic package using the method and apparatus of the invention.

FIG. 3 depicts another embodiment of the packaged integrated circuit 60 using the copper interconnection scheme and plastic packaging. In FIG. 3, silicon substrate 55 is shown having first isolation layer 57 with contact areas to silicon substrate 55 defined, first metal layer 59 is deposited over the isolation oxide 57, second isolation oxide layer 62 and 61 is formed over the first level metal 59 using conventional oxide producing techniques, second level metallization layer 63 is formed over the second level of oxide and contacting the first level metallization layer 59 in vias defined in the second level of oxide 61. Up to this point the device of FIG. 3 appears the same as for the embodiment of FIG. 2. However, in this embodiment bonding pads are defined as an area in the second level of metal 63. Copper top surface interconnect metal layer 45 is patterned so as to maintain a spacing away from the bond 67. Since the aluminum or gold bond wire 65 can be wedge bonded to the aluminum metal at bond 67, no barrier layer plating is required on copper layer 45.

As before, the next step is to place the completed structure in a plastic encapsulation package 52 using conventional transfer molding techniques well known in the art. Surprisingly, no passivation layer is required on copper layer 45, because as described above when the completed device is packaged in thermoplastic molding compound, the device passes rigorous reliability tests without the use of a passivation layer as would be required in the prior art.

Note that while the typical integrated circuit has two levels of interconnect and the copper is added as a surface level layer of interconnect, the embodiment above shows levels that are not required to take advantage of the copper interconnect of the invention. For example, the devices on the substrate could be connected with a copper first level of metal, the copper could be a second layer of metal coupled to a first level of aluminum, or going in the other direction, many layers could be interconnected before the copper surface interconnection layer is added on top.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plastic packaged integrated circuit, comprising:

a silicon substrate having devices formed within it;

a surface layer of plated copper top surface level interconnect material at least partially overlying said silicon substrate and in electrical contact with said devices; and a plastic package formed around said silicon substrate and said layer of plated copper surface level interconnect material and in physical contact with said copper surface level interconnect material.

2. The plastic packaged integrated circuit of claim 1 and further comprising:

a plated barrier layer of material formed over the entire copper top surface level interconnect material; and at least one bond wire coupled to said barrier layer of material by a wire bond at one end of said bond wire.

3. The plastic packaged integrated circuit of claim 2, and further comprising:

a leadframe having leads extending from outside of the plastic package into the plastic package;

wherein each of said at least one bond wires is further coupled to a lead of said leadframe.

4. The plastic packaged integrated circuit of claim 2, wherein said plated barrier metal comprises a metal taken from the group of nickel and nickel alloy.

5. The plastic packaged integrated circuit of claim 2, wherein said plated barrier metal comprises a metal taken from the group of palladium and palladium alloy.

6. The plastic packaged integrated circuit of claim 1, wherein said plated copper top surface level interconnect material is at least 10 microns thick.

7. The plastic packaged integrated circuit of claim 1, wherein said plated copper top surface level interconnect material is at least 20 microns thick.

8. The plastic packaged integrated circuit of claim 1, wherein said plated copper top surface level interconnect material is greater than 5 microns thick.

9. The plastic packaged integrated circuit of claim 1, and further comprising:

at least one level of interconnect material other than copper overlying said silicon substrate and electrically coupling said copper interconnect material to said devices.

10. The plastic packaged integrated circuit of claim 9, and further comprising at least one bond pad formed within said at least one level of interconnect other than said copper top surface level interconnect material, said bond pad being spaced apart from said copper top surface level interconnection material.

11. The plastic packaged integrated circuit of claim 10, wherein a bond wire is coupled to said at least one bond pad by a wire bond.

12. The plastic packaged integrated circuit of claim 10, and further comprising a leadframe having a plurality of leads, said leads extending from external to the plastic package into said plastic package, and said bond wire is coupled to at least one lead of said leadframe.

* * * * *

UNITED STATES PATENT AND TRADEMARK OFFICE
CERTIFICATE OF CORRECTION

PATENT NO. : 6,140,702
DATED : October 31, 2000
INVENTOR(S) : Taylor R. Efland; Dale J. Skelton; Quang X. Mai; Charles E. Williams It is certified that error appears in the above-identified patent and that said Letters Patent is hereby corrected as shown below:

Title page,
Please insert the following after "Related U.S. Applications Data":

-- Provisional Application No. 60/018,760 filed 05/31/96. --

Signed and Sealed this

Twenty-third Day of October, 2001

*Attest:*

NICHOLAS P. GODICI
*Attesting Officer*     *Acting Director of the United States Patent and Trademark Office*